United States Patent
Kim et al.

(10) Patent No.: US 10,643,690 B2
(45) Date of Patent: May 5, 2020

(54) TRANSPOSABLE FEEDBACK FIELD-EFFECT ELECTRONIC DEVICE AND ARRAY CIRCUIT USING THE SAME

(71) Applicant: Korea University Research and Business Foundation, Seoul (KR)

(72) Inventors: Sang Sig Kim, Seoul (KR); Kyoung Ah Cho, Seoul (KR); Jin Sun Cho, Seoul (KR); Doo Hyeok Lim, Seoul (KR); Sol A Woo, Gwacheon-si (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/181,419

(22) Filed: Nov. 6, 2018

(65) Prior Publication Data

US 2020/0075094 A1  Mar. 5, 2020

(30) Foreign Application Priority Data

Sep. 5, 2018 (KR) .................. 10-2018-0106112

(51) Int. Cl.
*G11C 11/54* (2006.01)
*G11C 11/412* (2006.01)
(Continued)

(52) U.S. Cl.
CPC .......... *G11C 11/54* (2013.01); *G11C 11/412* (2013.01); *G11C 11/419* (2013.01); *H01L 27/1052* (2013.01); *H01L 29/7391* (2013.01)

(58) Field of Classification Search
CPC ..... G11C 11/54; G11C 11/412; G11C 11/419; H01L 29/7391; H01L 27/1052
See application file for complete search history.

(56) References Cited

U.S. PATENT DOCUMENTS

2003/0142533 A1*  7/2003  Ueda .................. G11C 11/22
                                                        365/145
2010/0220523 A1*  9/2010  Modha ................. G11C 11/54
                                                        365/167
(Continued)

FOREIGN PATENT DOCUMENTS

KR  10-2013-0092930 A  8/2013
KR  10-2017-0127645 A  11/2017
(Continued)

OTHER PUBLICATIONS

Korean Office Action dated Nov. 28, 2019 in counterpart of Korean Patent Application No. 10-2018-0106112 (4 pages in Korean).

*Primary Examiner* — Khamdan N. Alrobaie
(74) *Attorney, Agent, or Firm* — NSIP Law

(57) ABSTRACT

The present disclosure discloses a transposable feedback field-effect electronic device and an array circuit using the feedback field-effect electronic device. According to one embodiment of the present disclosure, the feedback field-effect electronic device may include a diode structure, a plurality of gate electrodes, and a plurality of access electronic devices, wherein, when the diode structure receives voltage through a first gate electrode of the gate electrodes and a first access electronic device of the access electronic devices, first direction access may be performed, and when the diode structure receives voltage through a second gate electrode of the gate electrodes and a second access electronic device of the access electronic devices, second direction access may be performed.

13 Claims, 12 Drawing Sheets

(51) Int. Cl.
*G11C 11/419* (2006.01)
*H01L 27/105* (2006.01)
*H01L 29/739* (2006.01)

(56) References Cited

U.S. PATENT DOCUMENTS

2012/0084241 A1* 4/2012 Friedman ............... G06N 3/049
 706/27
2017/0330623 A1* 11/2017 Kim ....................... H01L 29/513
2018/0101359 A1* 4/2018 Harada .................. G06F 7/5443

FOREIGN PATENT DOCUMENTS

| KR | 10-1835231 B1 | 3/2018 |
| KR | 10-1857873 B1 | 6/2018 |

* cited by examiner

TRANSPOSABLE FEEDBACK FIELD-EFFECT ELECTRONIC DEVICE AND ARRAY CIRCUIT USING THE SAME

CROSS-REFERENCE TO RELATED APPLICATION

This application claims priority to Korean Patent Application No. 10-2018-0106112, filed on Sep. 5, 2018 in the Korean Intellectual Property Office, the disclosure of which is incorporated herein by reference.

BACKGROUND OF THE DISCLOSURE

Field of the Disclosure

The present disclosure relates to a feedback field-effect electronic device that is transposable and is usable as a synapse array device. More specifically, the present disclosure relates to a transposable feedback field-effect electronic device capable of controlling row-direction access and column-direction access by connecting two access transistors to a feedback field-effect transistor using two independent gate electrodes, and relates to an array circuit using the feedback field-effect electronic device.

Description of the Related Art

Neuromorphic technology is a technology that imitates human nerve structures using electronic devices and circuits.

Conventional von Neumann-based computers have a fast operating speed in sequential mathematical calculations, but have limitations in terms of speed and power consumption in calculating simultaneous inputs and outputs.

Among various neuromorphic technologies, spiking neural network technology may be used to imitate the neural networks and brainwave action of the brain to implement more sophisticated thinking capabilities.

To imitate these spiking neural networks, neurons and synapses must be implemented as electronic devices. In particular, studies are being conducted around the world to implement synapses responsible for memory and learning as electronic devices.

Synapse-imitating devices require characteristics such as bidirectional parallel operation, synapse plasticity, low power, and high integration.

In the case of conventional memory devices, bidirectional parallel operation may not be performed and implementation of synapse plasticity may be difficult. Accordingly, studies on memory devices made of various materials and having various structures, such as resistive random-access memory (ReRAM), phase change memory (PCM), and conductive bridge memory (CBRAM), have been conducted.

However, in fabrication of such memory devices, a conventional complementary metal-oxide-semiconductor (CMOS) process cannot be applied, so that the uniformity and stability of the device may be deteriorated, and the fabrication process is complicated.

To solve these problems, 8T-SRAM capable of realizing bidirectional parallel operation and synapse plasticity using a conventional CMOS process has been suggested. However, in the case of 8T-SRAM, eight transistors are included in one memory cell, and an additional circuit is required to implement synapse plasticity, resulting in limitation in the degree of integration.

Therefore, a novel synapse-imitating device based on a CMOS process and satisfying characteristics such as bidirectional parallel operation, synapse plasticity, low power, and high integration needs to be developed.

In the case of a memory device driven by a feedback loop memory mechanism, a CMOS process may be applied based on a silicon channel, and excellent switching characteristics and low operation voltage characteristics are exhibited.

However, bidirectional parallel operation and synapse plasticity cannot be implemented only by the memory device based on the feedback loop memory mechanism. In addition, there has been no technology to implement bidirectional parallel operation by connecting an access transistor to the memory device based on the feedback loop memory mechanism.

In addition, if synapse plasticity can be implemented in a synapse-imitating device, the synapse-imitating device may be used as a highly integrated synapse array device.

RELATED ART DOCUMENTS

Patent Documents

[Patent Document 1] Korean Patent Application Publication No. 10-2017-0127645, "DUAL-GATE MEMORY DEVICE INCLUDING VERTICAL SEMICONDUCTOR COLUMN"

[Patent Document 2] Korean Patent No. 10-1857873, "LOGIC SEMICONDUCTOR DEVICE"

[Patent Document 3] Korean Patent No. 10-1835231, "SEMICONDUCTOR DEVICE"

SUMMARY OF THE DISCLOSURE

Therefore, the present disclosure has been made in view of the above problems, and it is one object of the present disclosure to provide a feedback field-effect electronic device for controlling an array circuit to perform row-direction access and column-direction access in a transposable manner using two independent gate electrodes and two access transistors.

It is another object of the present disclosure to provide a feedback field-effect electronic device having characteristics such as bidirectional parallel operation, low power, and high integration.

It is another object of the present disclosure to provide a feedback field-effect electronic device that may be fabricated using a CMOS process, and that may be used in a spiking neural network.

It is another object of the present disclosure to provide a feedback field-effect electronic device corresponding to a memory device based on a feedback loop memory mechanism. According to the present disclosure, the feedback field-effect electronic device may be used as a synapse-imitating device. In this case, the degree of integration of the synapse-imitating device may be improved.

It is another object of the present disclosure to provide a feedback field-effect electronic device capable of quickly calculating simultaneous input and output values and reducing power consumption by implementing bidirectional parallel operation using access transistors.

It is another object of the present disclosure to provide a feedback field-effect electronic device capable of performing high speed learning by reducing arithmetic delay time by implementing synapse plasticity in the feedback field-effect electronic device corresponding to a synapse-imitating device.

It is yet another object of the present disclosure to provide a feedback field-effect electronic device using hysteresis of a feedback loop memory mechanism.

In accordance with one aspect of the present disclosure, provided is a feedback field-effect electronic device, including a diode structure, a plurality of gate electrodes, and a plurality of access electronic devices, wherein when the diode structure receives voltage through a first gate electrode of the gate electrodes and a first access electronic device of the access electronic devices, first direction access may be performed, and when the diode structure receives voltage through a second gate electrode of the gate electrodes and a second access electronic device of the access electronic devices, second direction access may be performed.

According to one embodiment of the present disclosure, the diode structure may include first and second conductivity-type regions, an intrinsic region disposed between the first and second conductivity-type regions, and a barrier region disposed between the intrinsic region and the second conductivity-type region, wherein the first gate electrode may be disposed on the periphery of the intrinsic region; the second gate electrode may be electrically insulated from the first gate electrode, and may be disposed to be symmetrical to the first gate electrode with respect to the intrinsic region; the first conductivity-type region may be connected to the drain electrode of the first access electronic device so that the first direction access is controlled; and the first conductivity-type region may be connected to the drain electrode of the second access electronic device so that the second direction access is controlled.

According to one embodiment of the present disclosure, the first gate electrode may be connected to a first word line, the second gate electrode may be connected to a second word line, the gate electrode of the first access electronic device may be connected to a third word line, and the gate electrode of the second access electronic device may be connected to a fourth word line.

According to one embodiment of the present disclosure, in the feedback field-effect electronic device, the first direction access may be performed when voltage pulses are applied through the first and third word lines, and the second direction access may be performed when voltage pulses are applied through the second and fourth word lines.

According to one embodiment of the present disclosure, when voltage pulses are simultaneously applied to the first gate electrode and the gate electrode of the first access electronic device through the first and third word lines, the feedback field-effect electronic device may store data in either the first or second logic state based on the magnitude of a bit-line voltage applied through the second conductivity-type region.

According to one embodiment of the present disclosure, when a bit-line voltage pulse is applied through the second conductivity-type region, and a voltage pulse is applied to the gate electrode of the first access electronic device through the third word line, the first access electronic device may output current associated with the data state of the intrinsic region from the intrinsic region through a first source line.

According to one embodiment of the present disclosure, the first conductivity-type region and the barrier region may be doped with an n-type impurity, and the second conductivity-type region may be doped with a p-type impurity; and the first direction access may correspond to row-direction access with respect to the diode structure, and the second direction access may correspond to column-direction access with respect to the diode structure.

According to one embodiment of the present disclosure, the feedback field-effect electronic device may further include a first gate insulating film disposed between the first gate electrode and the intrinsic region, and a second gate insulating film disposed between the second gate electrode and the intrinsic region.

In accordance with another aspect of the present disclosure, provided is an array circuit including a plurality of feedback field-effect electronic devices, each including a diode structure, first and second gate electrodes, and first and second access electronic devices; a first neuron element connected to the feedback field-effect electronic devices in a first direction; and a second neuron element connected to the feedback field-effect electronic devices in a second direction, wherein, when the first spike timing of the first neuron element is earlier than the second spike timing of the second neuron element, the feedback field-effect electronic devices may store data in a first logic state between the first spike timing and the second spike timing; and when the second spike timing is earlier than the first spike timing, the feedback field-effect electronic devices may store data in a second logic state between the first spike timing and the second spike timing.

According to one embodiment of the present disclosure, when the spike of the first neuron element occurs, a bit-line voltage pulse may be applied to the diode structure, and a third voltage pulse may be applied through a third word line connected to the gate electrode of the first access electronic device; and when the spike of the second neuron element occurs, a first voltage pulse may be applied through a first word line connected to the first gate electrode.

According to one embodiment of the present disclosure, the first and third voltage pulses may have identical pulse widths; when the third voltage pulse is applied after the first voltage pulse is applied, the feedback field-effect electronic devices may store the data in a second logic state; and when the first voltage pulse is applied after the third voltage pulse is applied, the feedback field-effect electronic devices may store the data in a first logic state.

According to one embodiment of the present disclosure, among the feedback field-effect electronic devices, a first feedback field-effect electronic device may be connected to a second feedback field-effect electronic device in the first direction, may receive the third voltage pulse in response to the spike of the first neuron element, and then may receive the first voltage pulse to store the first logic state data; and the second feedback field-effect electronic device may receive the first voltage pulse in response to the spike of the first neuron element, and then may receive the third voltage pulse to store the second logic state data.

According to one embodiment of the present disclosure, the array circuit may perform an operation of reading row-direction data based on current output through a first source line of the first access electronic device connected to the first feedback field-effect electronic device and current output through a second source line of the first access electronic device connected to the second feedback field-effect electronic device.

According to one embodiment of the present disclosure, when the spike of the first neuron element occurs, a bit-line voltage pulse may be applied to the diode structure, and a fourth voltage pulse may be applied through a fourth word line connected to the gate electrode of the second access electronic device; and when the spike of the second neuron element occurs, a second voltage pulse may be applied through a second word line connected to the second gate electrode.

According to one embodiment of the present disclosure, among the feedback field-effect electronic devices, a second feedback field-effect electronic device may be connected to a third feedback field-effect electronic device in the second direction, may receive the second voltage pulse in response to the spike of the first neuron element, and then may receive a fourth voltage pulse to store the second logic state data; and the third feedback field-effect electronic device may receive the fourth voltage pulse, and then may receive the second voltage pulse to store the first logic state data.

According to one embodiment of the present disclosure, the array circuit may perform an operation of reading column-direction data based on current output through a third source line of the second access electronic device connected to the first feedback field-effect electronic device and current output through a fourth source line of the second access electronic device connected to the third feedback field-effect electronic device.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF THE DISCLOSURE

Figure 1A:
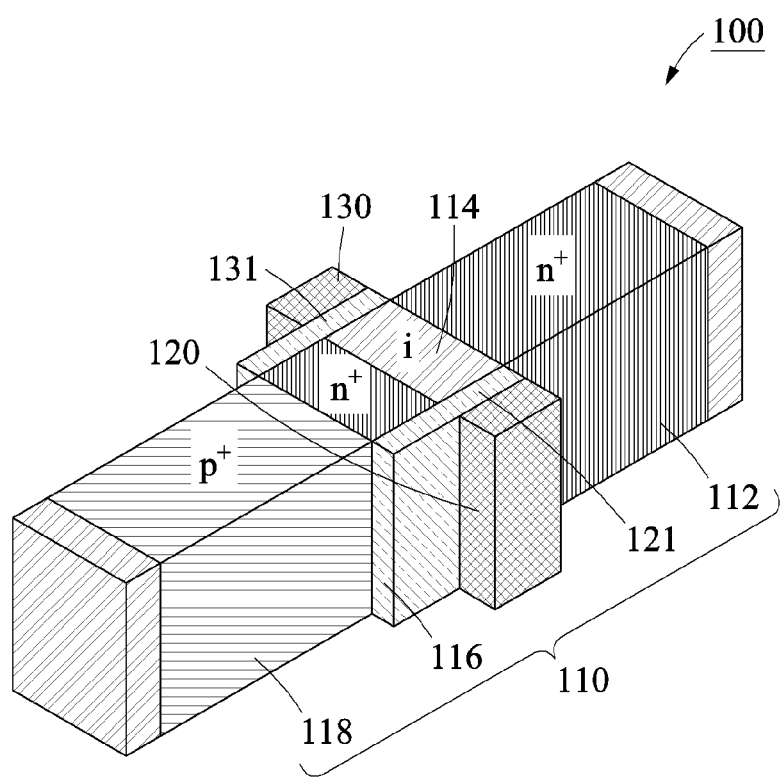
FIGS. 1A to 1C are drawings for explaining the diode structure of a feedback field-effect electronic device according to one embodiment of the present disclosure.

Hereinafter, various embodiments of the present disclosure will be described with reference to the accompanying drawings.

It should be understood that embodiments and terminology used herein are not intended to limit the present disclosure, but to include various modifications, equivalents, and/or alternatives of the embodiments.

In the following description of the present disclosure, detailed description of known functions and configurations incorporated herein will be omitted when it may make the subject matter of the present disclosure unclear.

The terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

In this specification, the term "configured to" may be used interchangeably with, for example, "suitable for", "having ability to", "changed to", "made to", "capable of", or "designed to".

In some situations, the expression "device configured to" may mean that the device "may do ~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless otherwise mentioned or clearly inferred from context, the expression "x uses a or b" means any one of natural inclusive permutations.

Terms such as "part" and "unit" used below means a unit for processing at least one function or operation, and may be implemented by hardware or software, or a combination of hardware and software.

Figure 1B:
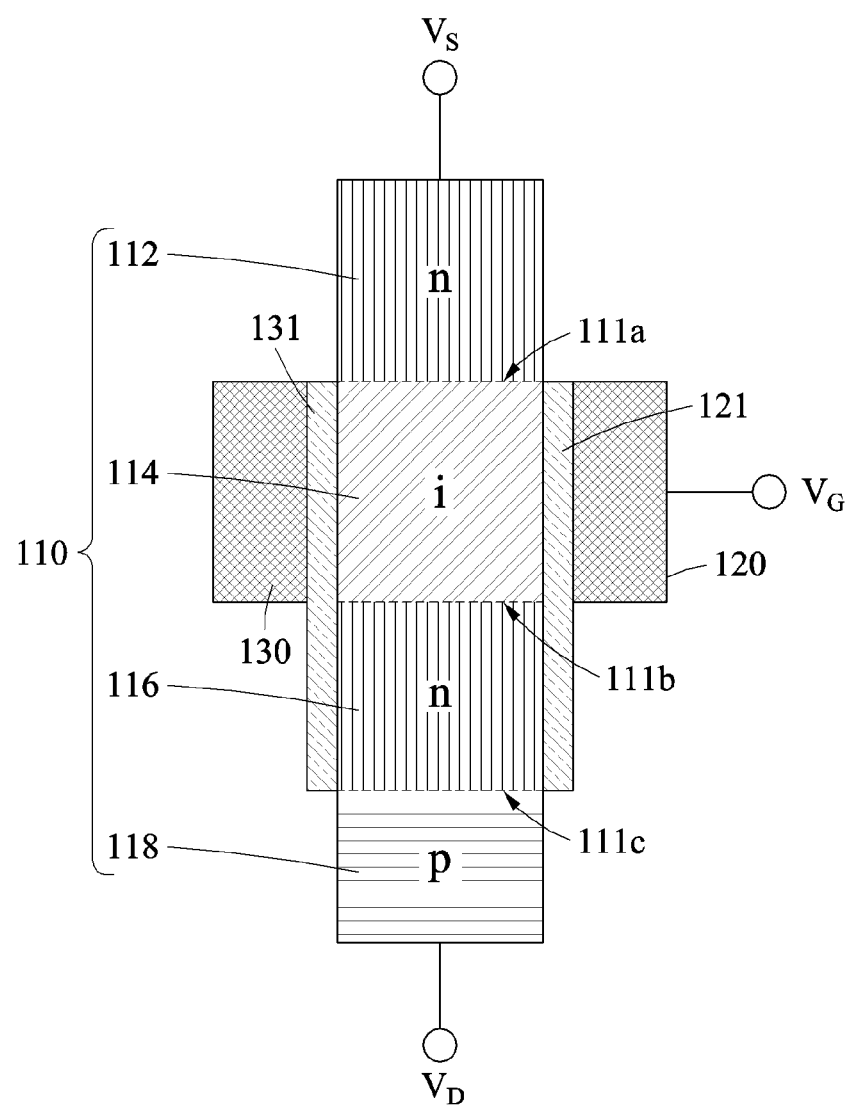
Figure 1C:
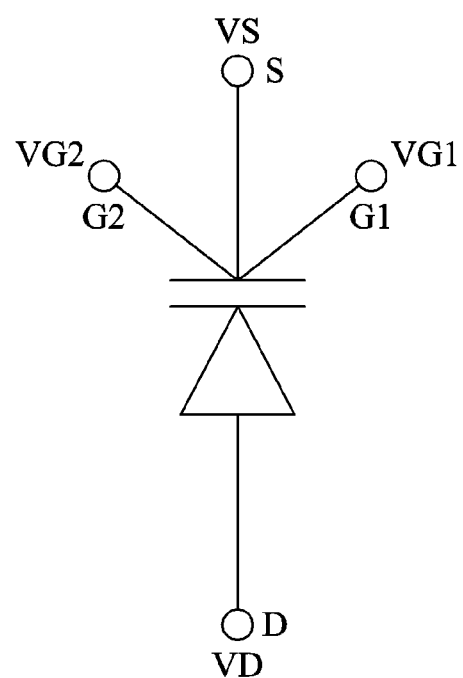

FIGS. 1A to 1C are drawings for explaining the diode structure of a feedback field-effect electronic device according to one embodiment of the present disclosure.

FIG. 1A illustrates a diode structure in which two independent gate electrodes are disposed according to one embodiment of the present disclosure. For example, the diode structure may be referred to as any one of a p-n-i-n transistor, a memory device, a semiconductor device, and a storage device.

Referring to FIG. 1A, a diode structure 110 may include a first conductivity-type region 112, an intrinsic region 114, a barrier region 116, and a second conductivity-type region 118, and first and second gate electrodes 120 and 130 may be formed and disposed in the intrinsic region 114.

For example, the first and second gate electrodes 120 and 130 may be formed by selective etching. In addition, selective etching is a technique widely used in a semiconductor process, and may refer to a technique for selectively removing unnecessary portions.

According to one embodiment of the present disclosure, the first gate electrode 120 may be disposed on one side or the periphery of the intrinsic region 114.

In addition, a first gate insulating film 121 may be located between the first gate electrode 120 and the intrinsic region 114, and a second gate insulating film 131 may be located between the second gate electrode 130 and the intrinsic region 114.

For example, the second gate electrode 130 may be electrically insulated from the first gate electrode 120, and may be disposed to be symmetrical to the first gate electrode 120 with respect to the intrinsic region 114.

That is, the first and second gate electrodes 120 and 130 may be symmetrical to each other. When the diode structure 110 performs a memory function in a feedback field-effect electronic device, the first and second gate electrodes 120 and 130 may support bidirectional operation of the memory function.

In this case, the bidirectional operation may include an operation of storing data in a first logic state and an operation of storing data in a second logic state when data is stored in the diode structure 110.

For example, data in a first logic state may represent "1", and data in a second logic state may represent "0". In addition, in the above description, data in a first logic state corresponds to "1", and data in a second logic state corresponds to "0", but such association may be flexibly changed depending on memory setting.

In addition, operation of storing data in a first logic state in the diode structure 110 as a memory may be referred to as programming.

In addition, operation of storing data in a second logic state in the diode structure 110 as a memory may be referred to as erasing.

For example, programming and erasing may be collectively referred to as update operations.

That is, the present disclosure may provide a feedback field-effect electronic device having properties such as bidirectional parallel operation, low power, and high integration.

The components of the diode structure 110 will be described in detail with reference to FIG. 1B.

Referring to FIG. 1B, the diode structure 110 may include the first and second conductivity-type regions 112 and 118, the intrinsic region 114 disposed between the first and second conductivity-type regions 112 and 118, and the barrier region 116 disposed between the intrinsic region 114 and the second conductivity-type region 118.

According to one embodiment of the present disclosure, in the diode structure 110, the first and second gate electrodes 120 and 130 may be independently disposed on the periphery of the intrinsic region 114.

In addition, the first and second gate electrodes 120 and 130 may be independently connected to voltage application lines, and may independently apply independent voltage pulses to the diode structure 110.

For example, the diode structure 110 may operate as a switch or volatile memory based on a drain voltage applied to the second conductivity-type region 118 and a gate voltage applied through any one of the first and second gate electrodes 120 and 130.

According to one embodiment of the present disclosure, the diode structure 110 may operate as an n-channel semiconductor device, and may exhibit similar characteristics to an n-channel MOSFET device except for hysteresis characteristics.

In addition, in the diode structure 110, the first conductivity-type region 112 may operate as a source, and the second conductivity-type region 118 may operate as a drain.

That is, the first conductivity-type region 112 may be referred to as a source region, and the second conductivity-type region 118 may be referred to as a drain region.

According to one embodiment of the present disclosure, the diode structure 110 may be vertically or horizontally formed on a substrate, and the substrate may be a single-crystal silicon substrate, and the diode structure 110 may be a silicon substrate in a polycrystalline or single crystal state.

For example, the diode structure 110 may be doped with a first or second conductivity type depending on vertical positions on a substrate.

In this case, the first conductivity type may be n-type, and the second conductivity type may be p-type.

According to one embodiment of the present disclosure, the first and second gate insulating films 121 and 131 may selectively surround the intrinsic region 114 or may surround both the barrier region 116 and the intrinsic region 114.

According to one embodiment of the present disclosure, the first and second gate insulating films 121 and 131 may be referred to as silicon oxide films.

According to another embodiment, the first and second gate insulating films 121 and 131 may be arranged so as to surround the intrinsic region 114.

For example, the diode structure 110 may exhibit a $p^+$-$n^+$-i-$n^+$ structure, and may include a first p-n junction 111$a$, a second p-n junction 111$b$, and a third p-n junction 111$c$.

In this case, $p^+$ may indicate a case wherein doping is performed with a high concentration of a p-type impurity, and $n^+$ may indicate a case wherein doping is performed with a high concentration of an n-type impurity.

For example, an n-channel may indicate a case wherein both sides of the diode structure 110 with respect to the intrinsic region 114 are doped with an n-type impurity.

In addition, a p-channel may indicate a case wherein both sides of the diode structure 110 with respect to the intrinsic region 114 are doped with a p-type impurity.

Therefore, the present disclosure may implement a feedback field-effect electronic device having a p-n junction structure, which may be fabricated using a CMOS process, and which may be used in a spiking neural network.

In addition, the present disclosure may implement a synapse-imitating device by using a feedback field-effect electronic device as a memory device based on a feedback loop memory mechanism, and may improve the degree of integration of the synapse-imitating device.

FIG. 1C shows a case wherein the diode structure 110 of FIGS. 1A and 1B is indicated by symbols on a circuit.

Referring to FIG. 1C, in the diode structure, first and second gate electrodes G1 and G2 that independently apply a gate voltage may be disposed.

The diode structure according to one embodiment of the present disclosure may differently operate depending on first and second gate voltages VG1 and VG2.

That is, the diode structure may exhibit symmetrical operation characteristics based on the first and second gate voltages VG1 and VG2.

Figure 2A:
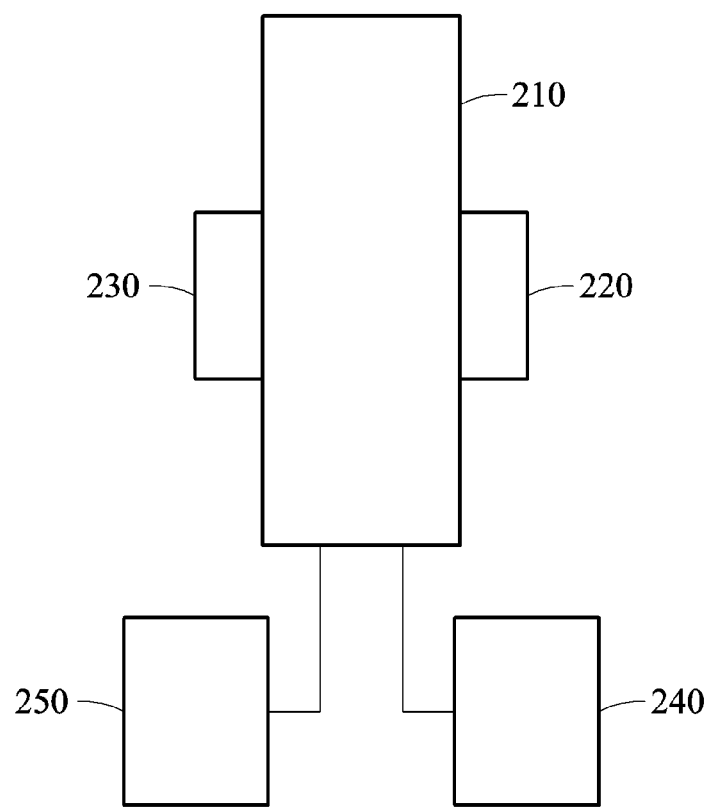
FIGS. 2A and 2B are drawings for explaining the structure of a feedback field-effect electronic device according to one embodiment of the present disclosure.

FIG. 2A is a drawing for explaining the structure of a feedback field-effect electronic device according to one embodiment of the present disclosure.

The feedback field-effect electronic device according to one embodiment of the present disclosure may perform a row direction operation and a column direction operation in parallel in a transposable manner.

Therefore, the feedback field-effect electronic device may be referred to as a transposable feedback field-effect electronic device or a feedback field-effect electronic device capable of easily performing bidirectional operation.

Referring to FIG. 2A, a feedback field-effect electronic device 200 includes a diode structure 210, first and second gate electrodes 220 and 230, and first and second access electronic devices 240 and 250.

For example, when voltage is applied to the feedback field-effect electronic device 200 through the first gate electrode 220 and the first access electronic device 240, the feedback field-effect electronic device 200 may perform first direction access. In this case, the applied voltage may be first and third gate voltages.

For example, when voltage is applied to the feedback field-effect electronic device 200 through the second gate electrode 230 and the second access electronic device 250, the feedback field-effect electronic device 200 may perform second direction access. In this case, the applied voltage may be second and fourth gate voltages.

For example, the feedback field-effect electronic device 200 may receive word-line voltages corresponding to the first and third gate voltages or the second and fourth gate voltages to perform operation as a memory device.

For example, the first direction access may correspond to operation performed in the row direction with respect to the diode structure 210, and the second direction access may correspond to operation performed in the column direction with respect to the diode structure 210.

Hereinafter, the structure of the feedback field-effect electronic device will be described more specifically with reference to FIG. 2B.

Figure 2B:
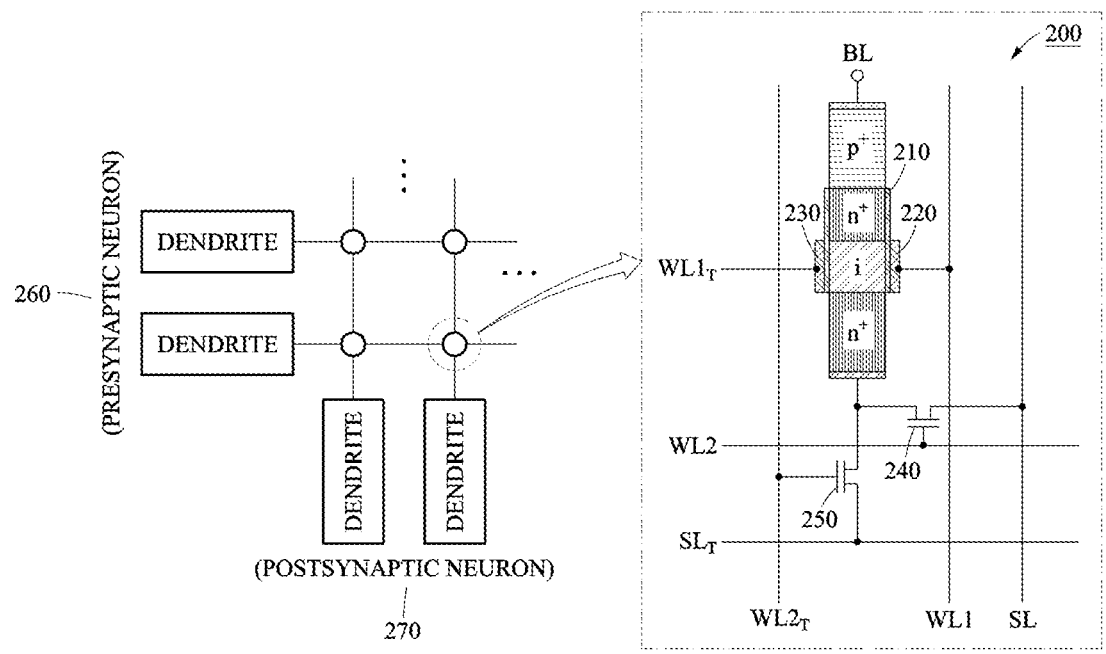

FIG. 2B is a drawing for explaining the structure of a feedback field-effect electronic device according to one embodiment of the present disclosure.

FIG. 2B shows an example of the configuration and structure of the feedback field-effect electronic device including a diode structure described in FIGS. 1A to 1C.

Referring to FIG. 2B, the feedback field-effect electronic device 200 may include the diode structure 210, the first and second gate electrodes 220 and 230, and the first and second access electronic devices 240 and 250.

In addition, the feedback field-effect electronic device 200 may be connected to presynaptic and postsynaptic neurons 260 and 270.

For example, the presynaptic neuron 260 may be referred to as a first neuron element, and the postsynaptic neuron 270 may be referred to as a second neuron element. In the following description, the present disclosure will be described using the names of the first and second neuron elements.

The first neuron element may include axons arranged in rows, wherein the axons are connected to the feedback field-effect electronic device 200.

The second neuron element may include dendrites arranged in columns, wherein the dendrites are connected to the feedback field-effect electronic device 200.

For example, from the view point of the spiking neural network, in a synapse, data read and write operations may be performed by the spike of the first neuron element connected to the front end of the feedback field-effect electronic device and the spike of the second neuron element connected to the back end of the feedback field-effect electronic device.

In this case, the spike of the first neuron element connected to the front end of the feedback field-effect electronic device 200 may apply voltage to a bit line BL and any one of first and second word lines WL1 and $WL1_T$ at the same time, and the spike of the second neuron element connected to the back end of the feedback field-effect electronic device 200 may apply voltage to a third or fourth word line WL2 or $WL2_T$.

For example, the diode structure 210 may include first and second conductivity-type regions, an intrinsic region disposed between the first and second conductivity-type regions, and a barrier region disposed between the intrinsic region and the second conductivity-type region.

According to one embodiment of the present disclosure, the first gate electrode 220 may be disposed on the periphery of the intrinsic region of the diode structure 210.

In addition, the first gate electrode 220 may be connected to the first word line WL1 to apply a gate voltage to the diode structure 210.

According to one embodiment of the present disclosure, the second gate electrode 230 may be disposed at the position symmetrical to the first gate electrode 220 with respect to the diode structure 210.

In addition, the second gate electrode 230 may be connected to the second word line $WL1_T$ to apply a gate voltage to the diode structure 210.

For example, the first access electronic device 240 may be connected to the first conductivity-type region of the diode structure 210 to control first direction access.

In addition, the second access electronic device 250 may be connected to the first conductivity-type region of the diode structure 210 to control second direction access.

For example, the first direction access may represent row-direction access with respect to the diode structure 210.

In addition, the second direction access may represent column-direction access with respect to the diode structure 210.

In addition, the gate electrode of the first access electronic device 240 may be connected to the third word line WL2, and the gate electrode of the second access electronic device 250 may be connected to the fourth word line $WL2_T$.

According to one embodiment of the present disclosure, the feedback field-effect electronic device 200 may perform the first direction access when voltage pulses are applied through the first and third word lines WL1 and WL2.

In addition, the feedback field-effect electronic device 200 may perform the second direction access when voltage pulses are applied through the second and fourth word lines $WL1_T$ and $WL2_T$.

For example, when voltage pulses are applied to the first gate electrode 220 and the gate electrode of the first access electronic device 240 through the first and third word lines WL1 and WL2 at the same time, the diode structure 210 may store data in either the first or second logic state based on the magnitude of a bit-line voltage BL applied through the second conductivity-type region of the diode structure 210.

That is, the feedback field-effect electronic device 200 according to one embodiment of the present disclosure may perform bidirectional operation using any one of the first and second gate electrodes 220 and 230 and the first and second access electronic devices 240 and 250.

The feedback field-effect electronic device 200 according to one embodiment of the present disclosure may perform bidirectional operation when a bit-line voltage and gate voltages are applied based on Table 1 below.

TABLE 1

|  | Programming | Erasing | Read | Standby (hold) |
|---|---|---|---|---|
| BL (V) | 1.2 V | 0.6 V | 1.2 V | 1.2 V |
| WL1 (V) | 0.8 V | 0.8 V | 0 V | 0 V |
| WL2 (V) | 1 V | 1 V | 1 V | 0.45 V |

According to one embodiment of the present disclosure, in the feedback field-effect electronic device 200, row-direction access may be performed using the first and third word lines WL1 and WL2.

First, in the feedback field-effect electronic device 200, when the diode structure 210 is activated as a memory by simultaneously receiving voltage through the first and third word lines WL1 and WL2, a first logic state is stored when the applied voltage is greater than 1.2 V.

That is, when a bit-line voltage applied to the feedback field-effect electronic device 200 is 1.2 V, a programming operation may be performed.

In addition, when a bit-line voltage applied to the feedback field-effect electronic device 200 corresponds to a value less than 1.2 V, e.g., 0.6 V, a second logic state is stored.

That is, when a bit-line voltage applied to the feedback field-effect electronic device 200 corresponds to 0.6 V, an erasing operation is performed.

In addition, in the feedback field-effect electronic device 200, a read operation may be performed as a voltage pulse is applied through only the third word line WL2 in a state wherein a bit-line voltage is applied.

That is, the feedback field-effect electronic device 200 may perform a read operation in a state wherein a bit-line voltage is kept constant.

In addition, in the feedback field-effect electronic device 200, when a voltage pulse is not applied to both the first and third word lines in a state wherein a bit-line voltage is applied, voltage applied to the second conductivity-type region may be maintained. In this case, the operation of maintaining the applied voltage may be referred to as hold.

Column-direction access may be performed by the second and fourth word lines $WL1_T$ and $WL2_T$.

In addition, in the feedback field-effect electronic device 200, data write and read operations may be performed under the same operating conditions as a row direction operation due to the structural symmetry of the first and second gate electrodes 220 and 230.

For example, the feedback field-effect electronic device 200 reduces voltage applied to the second and fourth word lines $WL1_T$ and $WL2_T$ applied to two access transistors to perform a standby operation so that current flowing in the diode structure 210 is reduced. Thus, the amount of standby power consumed in the synapse array device is reduced.

According to one embodiment of the present disclosure, in the feedback field-effect electronic device 200, when the bit-line voltage pulse BL is applied through the second conductivity-type region of the diode structure 210, and a voltage pulse is applied to the gate electrode of the first access electronic device 240 through the third word line WL2, the first access electronic device 240 may output current associated with the data state of the diode structure from the diode structure 210 through a first source line SL based on the magnitude of the bit-line voltage BL.

Figure 3:
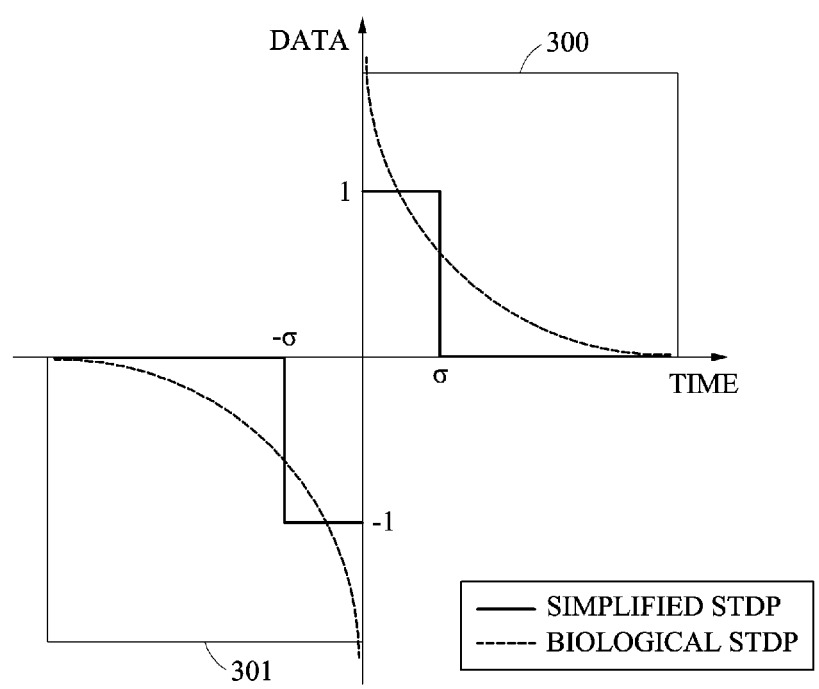
FIG. 3 is a graph showing the result of comparing a simplified spike-timing-dependent plasticity learning mechanism according to one embodiment of the present disclosure with a biological spike-timing-dependent plasticity learning mechanism.

FIG. 3 is a graph showing the result of comparing a simplified spike-timing-dependent plasticity learning mechanism according to one embodiment of the present disclosure with a biological spike-timing-dependent plasticity learning mechanism.

Referring to FIG. 3, spike-timing-dependent plasticity (STDP) may be divided into simplified STDP and biological STDP.

In the graph, the horizontal axis may represent change in time, and the vertical axis may represent change in data.

In this case, the change in time may correspond to a period excluding the time point at which the spike of the first neuron element occurs from the time point at which the spike of the second neuron element occurs.

In addition, the change in time may correspond to a time window corresponding to a time difference in occurrence of the spikes connected to the first and second neuron elements in an STDP learning mechanism.

The feedback field-effect electronic device according to one embodiment of the present disclosure may exhibit simplified STDP such as signaling, and biological STDP may indicate a mechanism by which synapse connection strength is changed in a synaptic device in the animal's brain.

That is, the feedback field-effect electronic device according to one embodiment of the present disclosure may implement synapse plasticity based on simplified STDP.

The feedback field-effect electronic device according to one embodiment of the present disclosure may perform a data writing operation within a time window.

In the feedback field-effect electronic device according to one embodiment of the present disclosure, as with the biological STDP mechanism, when the spike of the first synapse element occurs before the spike of the second synapse element, "1" is recorded, as shown in a rising section 300.

In addition, in the feedback field-effect electronic device, when the spike of the second synapse element occurs before the spike of the first synapse element, "0" is recorded, as shown in a falling section 301.

The value of a time window may be set to any value, typically 10 ms.

For example, the rising section 300 may be referred to as long-term potentiation (LTP), and the falling section 301 may be referred to as long-term depression (LTD).

According to one embodiment of the present disclosure, when the first spike timing of the first neuron element is earlier than the second spike timing of the second neuron element, a plurality of feedback field-effect electronic devices may store data in a first logic state between the first spike timing and the second spike timing.

In addition, when the second spike timing is earlier than the first spike timing, the feedback field-effect electronic devices may store data in a second logic state between the first spike timing and the second spike timing.

That is, the present disclosure may implement bidirectional parallel operation using access transistors, thereby implementing a feedback field-effect electronic device capable of quickly calculating simultaneous input and output values and reducing power consumption.

In addition, the present disclosure may implement a feedback field-effect electronic device capable of performing high speed learning by reducing arithmetic delay time by implementing synapse plasticity in the feedback field-effect electronic device corresponding to a synapse-imitating device.

Figure 4:
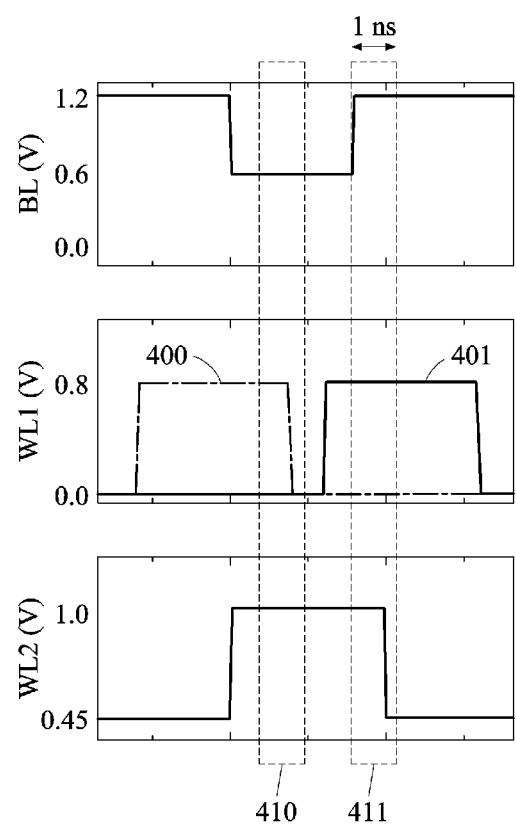
FIG. 4 includes graphs relating to a pulse width modulation method for implementing simplified spike-timing-dependent plasticity according to one embodiment of the present disclosure.

FIG. 4 includes graphs relating to a pulse width modulation method for implementing simplified spike-timing-dependent plasticity according to one embodiment of the present disclosure.

Referring to FIG. 4, the feedback field-effect electronic device according to one embodiment of the present disclosure may modulate the voltage pulse widths of the bit-line voltage BL and the first and third word lines WL1 and WL2 to implement simplified spike-timing-dependent plasticity (STDP). Hereinafter, simplified spike-timing-dependent plasticity is referred to as simplified STDP.

According to one embodiment of the present disclosure, in the simplified STDP, the feedback field-effect electronic device performs any one operation of programming and erasing when the difference between the spike timing of the first neuron element and the spike timing of the second neuron element is within a time window.

According to one embodiment of the present disclosure, the spike of the first neuron element may apply the bit voltage pulse of a bit line BL to the diode structure, and may apply a third voltage pulse through the third word line WL2 connected to the gate electrode of the first access electronic device.

In this case, the spike of the first neuron element may correspond to the spike of the presynaptic neuron described in FIG. 2B.

For example, the spike of the second neuron element may apply a first voltage pulse through the first word line WL1 connected to the first gate electrode.

In this case, the spike of the second neuron element may correspond to the spike of the postsynaptic neuron described in FIG. 2B.

For example, the size of the time window may correspond to any one of the pulse width of the third voltage pulse and the pulse width of the first voltage pulse.

In addition, the pulse width of the third voltage pulse and the pulse width of the first voltage pulse may be the same, and the bit voltage pulse may be relatively small.

More specifically, when the pulse width of the third voltage pulse and the pulse width of the first voltage pulse are 5 ns, the bit voltage pulse may be 4 ns, showing a difference of about 1 ns therebetween, and the size of the time window may be 5 ns.

In FIG. 4, time intervals 410 and 411 show a pulse width difference of 1 ns.

More specifically, the time interval 410 may represent a period in which the spike of the second neuron element occurs before the spike of the first neuron element and the feedback field-effect electronic device performs an erasing operation to store data in a second logic state.

The time interval 411 may represent a period in which the spike of the first neuron element occurs before the spike of the second neuron element and the feedback field-effect electronic device performs a programming operation to store data in a first logic state.

That is, the feedback field-effect electronic device may perform a programming operation or erasing operation based on the application order of the first and third voltage pulses when a difference occurs in the application time of the first and third voltage pulses in the time window.

For example, the pulse width may correspond to a time when the voltage of a first state is applied or a time when the voltage of a second state is applied.

Based on a bit voltage, the voltage of the first state may correspond to 1.2 V, and the voltage of the second state may correspond to 0.6 V.

Referring to FIG. 4, the pulse width of the bit voltage pulse may correspond to a time when the voltage of the second state is applied.

In addition, the first state voltage of the first voltage pulse may correspond to 1 V, and the second state voltage may correspond to 0.45 V.

The pulse width of the first voltage pulse may correspond to a time when the first state voltage is applied.

In addition, the first state voltage of the third voltage pulse may correspond to 0.8 V, and the second state voltage may correspond to 0 V.

The pulse width of the second voltage pulse may correspond to a time when the first state voltage is applied.

Figure 5:
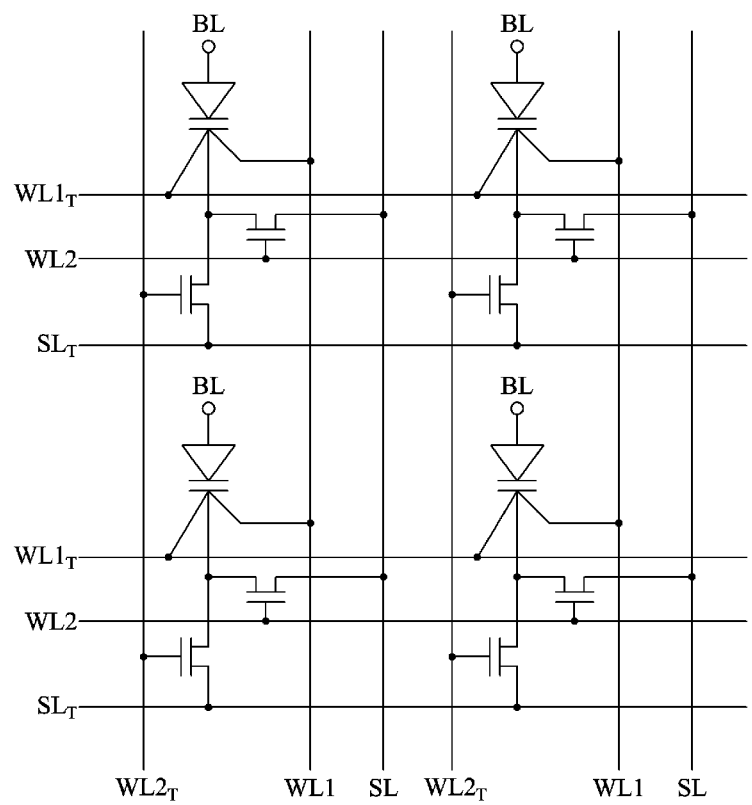
FIG. 5 is a drawing for explaining an array circuit according to one embodiment of the present disclosure.

FIG. 5 is a drawing for explaining an array circuit according to one embodiment of the present disclosure.

Referring to FIG. 5, an array circuit may consist of first to fourth feedback field-effect electronic devices. That is, the first to fourth feedback field-effect electronic devices may constitute a 2×2 array circuit.

In the array circuit, the first and second feedback field-effect electronic devices may be connected to each other in a row, and may receive voltage through the bit line BL and the first and third word lines WL1 and WL2 to perform a row access operation.

For example, the array circuit may process data stored in a plurality of feedback field-effect electronic devices connected in a row at the same time when a row access operation is performed.

In addition, in the array circuit, the first and third feedback field-effect electronic devices may be connected to each other in a column, and may receive voltage through the bit line BL and the second and fourth word lines $WL1_T$ and $WL2_T$ to perform a column access operation.

For example, the array circuit may process data stored in a plurality of feedback field-effect electronic devices connected in a column at the same time when a column access operation is performed.

Figure 6A:
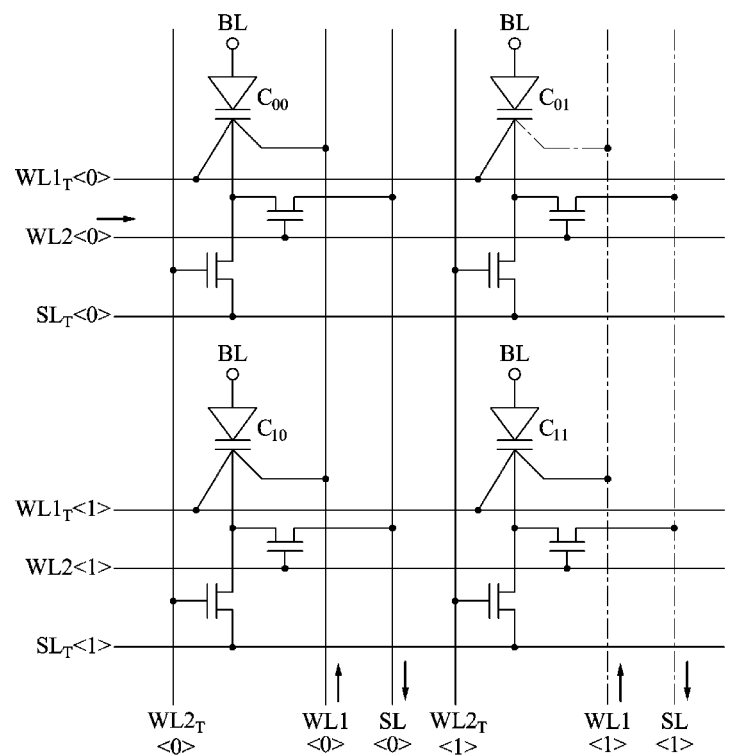
FIGS. 6A and 6B are drawings for explaining the row-direction access of a feedback field-effect electronic device according to one embodiment of the present disclosure.
Figure 6B:
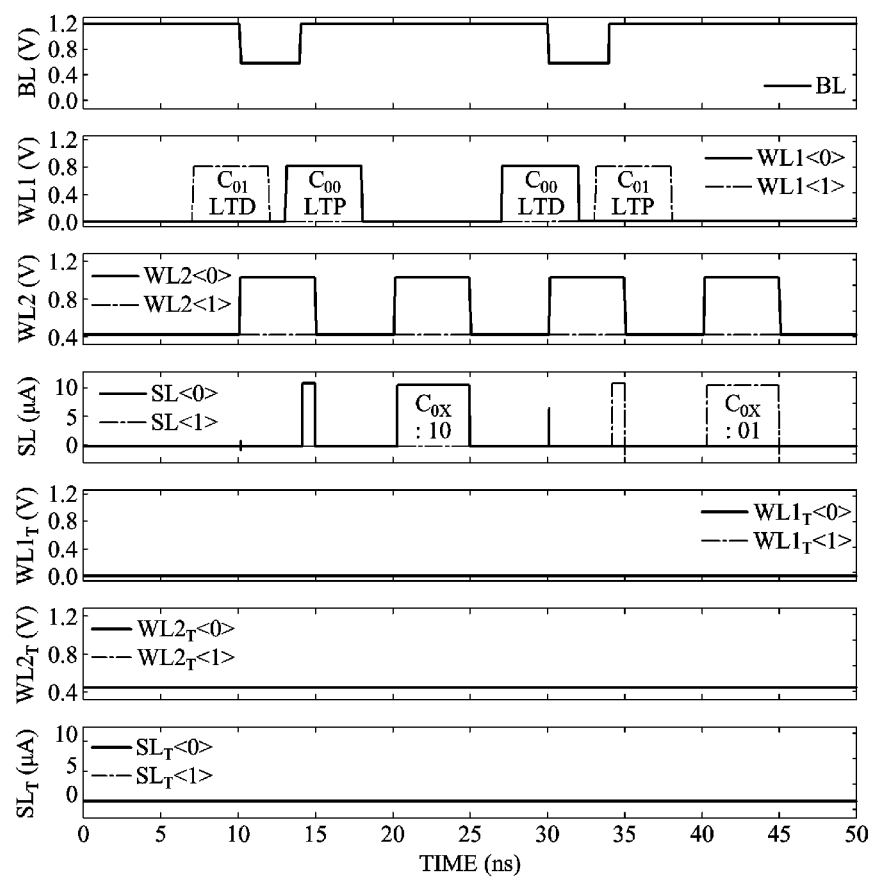

FIGS. 6A and 6B are drawings for explaining the row-direction access of a feedback field-effect electronic device according to one embodiment of the present disclosure.

Referring to FIG. 6A, a plurality of feedback field-effect electronic devices may constitute an array circuit.

According to one embodiment of the present disclosure, among the feedback field-effect electronic devices, a first feedback field-effect electronic device $C_{00}$ may be connected to a second feedback field-effect electronic device $C_{01}$ in a first direction, may receive a third voltage pulse WL2<0> in response to the spike of the first neuron element, and then may receive the first voltage pulse WL1<0> to store first logic state data.

For example, the second feedback field-effect electronic device $C_{01}$ may receive a first voltage pulse WL1<1> in response to the spike of the first neuron element, and then may receive the third voltage pulse WL2<0> to store second logic state data.

According to one embodiment of the present disclosure, the array circuit may perform an operation of reading row-direction data based on current output through a first source line SL<0> of the first access electronic device connected to the first feedback field-effect electronic device and current output through a second source line SL<1> of the first access electronic device connected to the second feedback field-effect electronic device.

Referring to FIG. 6B, when the spike of the first neuron element occurs, a gate voltage corresponding to WL2<0> may be applied to the bit-line voltage BL and the third word line, and when the spike of the second neuron element occurs, a gate voltage corresponding to WL1<0> and WL1<1> may be applied to the first word line.

Therefore, in the array circuit, since WL1<0> is followed by WL2<0> in a data writing process, long term potentiation (LTP) may be generated in the first feedback field-effect electronic device $C_{00}$ so that "1" is recorded. In addition, since WL1<1> is followed by WL2<0>, long term depression (LTD) may be generated in the second feedback field-effect electronic device $C_{01}$ so that "0" is recorded.

According to one embodiment of the present disclosure, in the array circuit, the fact that "10" is written in the first row may be confirmed by sensing SL<0> and SL<1> current.

In addition, referring to the graph, in the second data writing process, since WL1<0> precedes WL2<0> and WL1<1> is followed by WL2<0>, the process of recording "01" in the first row may be confirmed by performing consecutive read operations.

For example, the voltage of the bit line BL may correspond to 0.6 V to 1.2 V, the voltage of the first word line WL1 may correspond to 0 V to 0.8 V, the voltage of the second word line WL2 may correspond to 0.45 V to 1 V, the voltage of the third word line $WL1_T$ may correspond to 0 V to 0.8 V, and the voltage of the second word line $WL2_T$ may correspond to 0.45 V to 1 V.

For example, current measured through the source line may correspond to 0 µA to 10 µA.

Figure 7A:
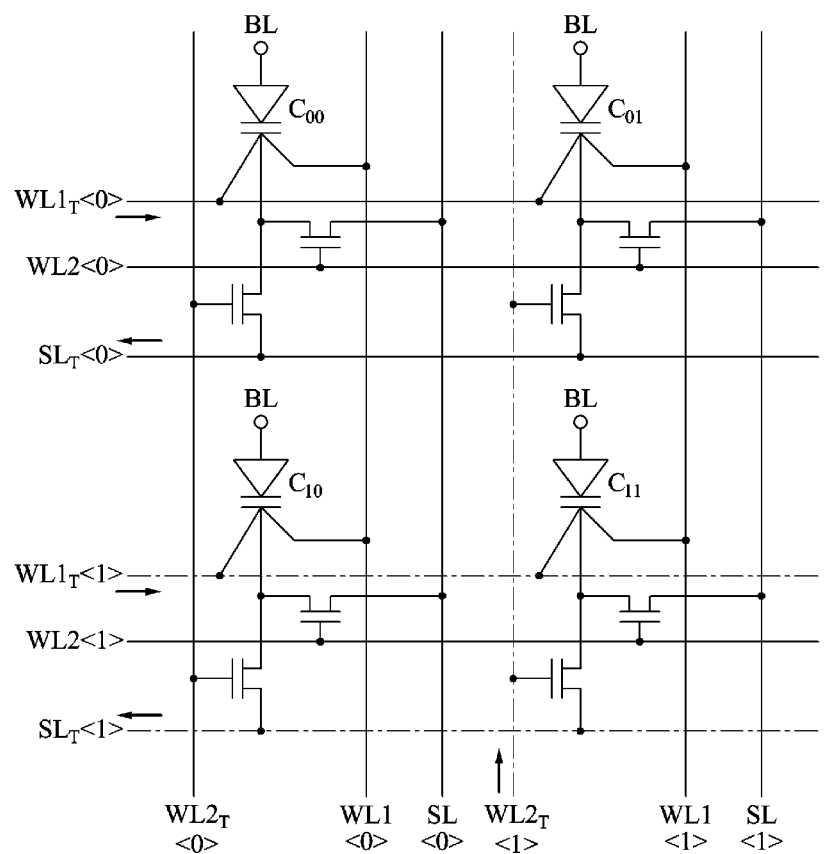
FIGS. 7A and 7B are drawings for explaining the column-direction access of a feedback field-effect electronic device according to one embodiment of the present disclosure.
Figure 7B:
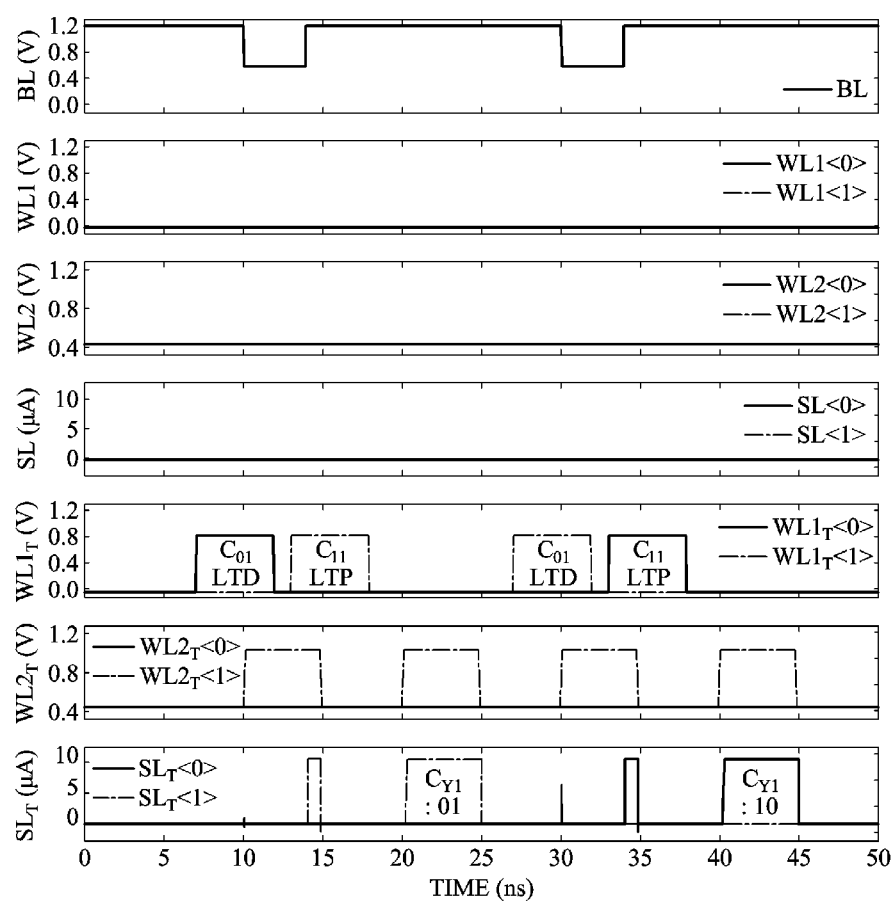

FIGS. 7A and 7B are drawings for explaining the column-direction access of a feedback field-effect electronic device according to one embodiment of the present disclosure.

Referring to FIG. 7A, the array circuit may consist of a plurality of feedback field-effect electronic devices. Among the feedback field-effect electronic devices, the second feedback field-effect electronic device $C_{01}$ may be connected to a third feedback field-effect electronic device $C_{11}$ in a second direction.

For example, the second feedback field-effect electronic device $C_{01}$ may receive a second voltage pulse $WL1_T$ in response to the spike of the first neuron element, and then may receive a fourth voltage pulse $WL2_T$ to store second logic state data.

According to one embodiment of the present disclosure, the third feedback field-effect electronic device $C_{11}$ may receive the fourth voltage pulse $WL2_T$, and then may receive the second voltage pulse $WL1_T$ to store first logic state data.

According to one embodiment of the present disclosure, the array circuit may perform an operation of reading column-direction data based on current output through a source line $SL_T$<0> of the second access electronic device connected to the second feedback field-effect electronic device $C_{01}$ and current output through a source line $SL_T$<1> of the second access electronic device connected to the third feedback field-effect electronic device $C_{11}$.

Referring to FIG. 7B, when the spike of the first neuron element occurs, a gate voltage corresponding to $WL2_T$<1> may be applied to the bit-line voltage BL and the fourth word line, and when the spike of the second neuron element occurs, a gate voltage corresponding to $WL1_T$<0> and $WL1_T$<1> may be applied to the second word line.

Therefore, in the array circuit, since $WL1_T$<0> precedes $WL2_T$<1> in a first data writing process, LTD may be generated in the second feedback field-effect electronic device $C_{01}$ so that "0" is recorded. In addition, since $WL1_T$<1> is followed by $WL2_T$<1>, LTP may be generated in the third feedback field-effect electronic device C11 so that "1" is recorded.

According to one embodiment of the present disclosure, in the array circuit, the fact that "01" is recorded in the first row may be confirmed by sensing SLT<0> and SLT<1> current.

In addition, referring to the graph, in the second data writing process, since WL1T<0> is followed by WL2T<1> and WL1T<1> precedes WL2T<1>, the process of recording "10" in the first row may be confirmed by performing consecutive read operations.

According to FIGS. 6A to 7B described above, row-direction access and column-direction access may be performed in the array circuit using two independent gate electrodes and two access transistors.

In addition, the present disclosure may implement a feedback field-effect electronic device using hysteresis of a feedback loop memory mechanism.

The present disclosure can implement a feedback field-effect electronic device for controlling an array circuit to perform row-direction access and column-direction access in a transposable manner using two independent gate electrodes and two access transistors.

The present disclosure can implement a feedback field-effect electronic device having characteristics such as bidirectional parallel operation, low power, and high integration.

The present disclosure can implement a feedback field-effect electronic device that can be fabricated using a CMOS process, and that can be used in a spiking neural network.

The present disclosure can implement a synapse-imitating device by using a feedback field-effect electronic device as a memory device based on a feedback loop memory mechanism, and can improve the degree of integration of the synapse-imitating device.

The present disclosure can implement a feedback field-effect electronic device capable of quickly calculating simultaneous input and output values and reducing power consumption by implementing bidirectional parallel operation using access transistors.

The present disclosure can implement a feedback field-effect electronic device capable of performing high speed learning by reducing arithmetic delay time by implementing synapse plasticity in the feedback field-effect electronic device corresponding to a synapse-imitating device.

The present disclosure can implement a feedback field-effect electronic device using hysteresis of a feedback loop memory mechanism.

The claims of the present disclosure or the methods according to embodiments described in this specification may be implemented in hardware, software, or a combination of hardware and software.

Such software may be stored on a computer-readable storage medium. The computer-readable storage medium stores at least one program (software module) including instructions for causing an electronic device to perform the method of the present disclosure when executed by at least one processor in the electronic device.

Such software may be stored in the form of a volatile storage device or a non-volatile storage device such as read only memory (ROM), in the form of memory such as random access memory (RAM), memory chips, and device or integrated circuits, or in an optical or magnetic readable medium, such as compact disc-ROMs (CD-ROMs), digital versatile discs (DVDs), magnetic disks, and magnetic tapes.

The storage device and medium are machine-readable storage means suitable for storing programs including instructions for implementing embodiments when executed.

In the above-described specific embodiments, elements included in the disclosure are expressed in singular or plural in accordance with the specific embodiments.

However, the singular or plural representations are appropriately selected for the situation presented for convenience of explanation, and the above-described embodiments are not limited to the singular or plural constituent elements. In addition, elements may be composed of the singular number, even when the elements are expressed in the plural number, and an element may be composed of the plural number, even when the element is expressed in the singular number.

The aforementioned description is provided only to illustrate embodiments according to the present disclosure. Those skilled in the art will appreciate that various modifications, additions and substitutions are possible, without departing from the scope and spirit of the disclosure.

Therefore, it should be understood that there is no intent to limit the disclosure to the embodiments disclosed, rather, the disclosure is to cover all modifications, equivalents, and alternatives falling within the spirit and scope of the disclosure as defined by the claims.

DESCRIPTION OF SYMBOLS

110: DIODE STRUCTURE
112: FIRST CONDUCTIVITY-TYPE REGION
114: INTRINSIC REGION
116: BARRIER REGION
118: SECOND CONDUCTIVITY-TYPE REGION
120: FIRST GATE ELECTRODE
121: FIRST GATE INSULATING FILM
130: SECOND GATE ELECTRODE
131: SECOND GATE INSULATING FILM
200: FEEDBACK FIELD-EFFECT ELECTRONIC DEVICE
210: DIODE STRUCTURE
220: FIRST GATE ELECTRODE
230: SECOND GATE ELECTRODE
240: FIRST ACCESS ELECTRONIC DEVICE
250: SECOND ACCESS ELECTRONIC DEVICE

What is claimed is:

1. A feedback field-effect electronic device, comprising: a diode structure, a plurality of gate electrodes, and a plurality of access electronic devices,
wherein, when the diode structure receives voltage through a first gate electrode of the gate electrodes and a first access electronic device of the access electronic devices, first direction access is performed, and when the diode structure receives voltage through a second gate electrode of the gate electrodes and a second access electronic device of the access electronic devices, second direction access is performed,
wherein the diode structure comprises first and second conductivity-type regions, an intrinsic region disposed between the first and second conductivity-type regions, and a barrier region disposed between the intrinsic region and the second conductivity-type region,
wherein the first gate electrode is disposed on periphery of the intrinsic region;
the second gate electrode is electrically insulated from the first gate electrode, and is disposed to be symmetrical to the first gate electrode with respect to the intrinsic region;
the first conductivity-type region is connected to a drain electrode of the first access electronic device so that the first direction access is controlled; and
the first conductivity-type region is connected to a drain electrode of the second access electronic device so that the second direction access is controlled.

2. The feedback field-effect electronic device according to claim 1, wherein the first gate electrode is connected to a first word line, the second gate electrode is connected to a second word line, a gate electrode of the first access electronic device is connected to a third word line, and a gate electrode of the second access electronic device is connected to a fourth word line.

3. The feedback field-effect electronic device according to claim 2, wherein the first direction access is performed when voltage pulses are applied through the first and third word lines, and the second direction access is performed when voltage pulses are applied through the second and fourth word lines.

4. The feedback field-effect electronic device according to claim 3, wherein, when voltage pulses are simultaneously applied to the first gate electrode and the gate electrode of the first access electronic device through the first and third word lines, data in either a first or second logic state is stored based on a magnitude of a bit-line voltage applied through the second conductivity-type region.

5. The feedback field-effect electronic device according to claim 3, wherein, when a bit-line voltage pulse is applied through the second conductivity-type region, and a voltage pulse is applied to a gate electrode of the first access electronic device through the third word line, the first access electronic device outputs current associated with a data state of the intrinsic region from the intrinsic region through a first source line.

6. The feedback field-effect electronic device according to claim 1, wherein the first conductivity-type region and the barrier region are doped with an n-type impurity, and the second conductivity-type region is doped with a p-type impurity; and
the first direction access corresponds to row-direction access with respect to the diode structure, and the second direction access corresponds to column-direction access with respect to the diode structure.

7. The feedback field-effect electronic device according to claim 1, further comprising:
a first gate insulating film disposed between the first gate electrode and the intrinsic region; and
a second gate insulating film disposed between the second gate electrode and the intrinsic region.

8. An array circuit, comprising:
a plurality of feedback field-effect electronic devices, each comprising a diode structure, first and second gate electrodes, and first and second access electronic devices;
a first neuron element connected to the feedback field-effect electronic devices in a first direction; and
a second neuron element connected to the feedback field-effect electronic devices in a second direction,
wherein, when first spike timing of the first neuron element is earlier than second spike timing of the second neuron element, the feedback field-effect electronic devices store data in a first logic state between the first spike timing and the second spike timing; and
when the second spike timing is earlier than the first spike timing, the feedback field-effect electronic devices store data in a second logic state between the first spike timing and the second spike timing,
wherein, when spike of the first neuron element occurs, a bit-line voltage pulse is applied to the diode structure, and a third voltage pulse is applied through a third word line connected to a gate electrode of the first access electronic device or a fourth voltage pulse is applied through a fourth word line connected to a gate electrode of the second access electronic device; and
when spike of the second neuron element occurs, a first voltage pulse is applied through a first word line connected to the first gate electrode or a second voltage pulse is applied through a second word line connected to the second gate electrode.

9. The array circuit according to claim 8, wherein the first and third voltage pulses have identical pulse widths;

when the third voltage pulse is applied after the first voltage pulse is applied, the feedback field-effect electronic devices store the data in a second logic state; and when the first voltage pulse is applied after the third voltage pulse is applied, the feedback field-effect electronic devices store the data in a first logic state.

10. The array circuit according to claim 8, wherein, among the feedback field-effect electronic devices, a first feedback field-effect electronic device is connected to a second feedback field-effect electronic device in the first direction, receives the third voltage pulse in response to spike of the first neuron element, and then receives the first voltage pulse to store the first logic state data; and the second feedback field-effect electronic device receives the first voltage pulse in response to spike of the first neuron element, and then receives the third voltage pulse to store the second logic state data.

11. The array circuit according to claim 10, wherein an operation of reading row-direction data is performed based on current output through a first source line of the first access electronic device connected to the first feedback field-effect electronic device and current output through a second source line of the first access electronic device connected to the second feedback field-effect electronic device.

12. The array circuit according to claim 8, wherein, among the feedback field-effect electronic devices, a second feedback field-effect electronic device is connected to a third feedback field-effect electronic device in the second direction, receives the second voltage pulse in response to spike of the first neuron element, and then receives a fourth voltage pulse to store the second logic state data; and the third feedback field-effect electronic device receives the fourth voltage pulse, and then receives the second voltage pulse to store the first logic state data.

13. The array circuit according to claim 12, wherein an operation of reading column-direction data is performed based on current output through a third source line of the second access electronic device connected to the first feedback field-effect electronic device and current output through a fourth source line of the second access electronic device connected to the third feedback field-effect electronic device.

* * * * *